United States Patent [19]

Wada et al.

[11] 4,454,525

[45] Jun. 12, 1984

[54] IGFET HAVING CRYSTAL ORIENTATION NEAR (944) TO MINIMIZE WHITE RIBBON

[75] Inventors: Kunihiko Wada; Motoo Nakano, both of Yokohama, Japan

[73] Assignee: Fujitsu Limited, Kawasaki, Japan

[21] Appl. No.: 215,822

[22] Filed: Dec. 12, 1980

[30] Foreign Application Priority Data

Dec. 28, 1979 [JP] Japan ................................ 54-170983

[51] Int. Cl.$^3$ ............................................ H01L 29/78
[52] U.S. Cl. ........................................ 357/23; 357/50; 357/60
[58] Field of Search .................. 357/23 CS, 60, 50, 54

[56] References Cited

U.S. PATENT DOCUMENTS

| | | | |
|---|---|---|---|
| 3,636,421 | 1/1972 | Takeishi et al. | 357/60 |
| 3,796,612 | 3/1974 | Allison | 357/60 |
| 3,821,783 | 6/1974 | Sugita et al. | 357/60 |
| 4,000,019 | 12/1976 | van den Brekel | 357/60 |
| 4,113,515 | 9/1978 | Kooi et al. | 357/23 CS |
| 4,216,489 | 8/1980 | Clemens et al. | 357/46 |
| 4,354,307 | 10/1982 | Vinson et al. | 29/571 |

*Primary Examiner*—William D. Larkins
*Attorney, Agent, or Firm*—Staas & Halsey

[57] ABSTRACT

Disclosed here is an IGFET formed on the single crystal silicon substrate where the major plane surface is deviated within the range from 22 degree to 34 degree toward the crystallographic surface {1,1,1,} from {1,0,0} or on the silicon epitaxial layer formed on said substrate. Here, generation of silicon nitride is suppressed, which is newly formed under the mask in the selective oxidation process using the silicon nitride as the mask and also is the main cause of lowering the breakdown voltage of the gate insulating film. In addition, various kinds of functional characteristics depending on the crystallographic surface orientation are not interfered at all. Thereby, the present invention can offer an IGFET which drastically improved the breakdown voltage failure rate of the gate insulating film while keeping the functional characteristics at the best condition.

8 Claims, 14 Drawing Figures

IGFET HAVING CRYSTAL ORIENTATION NEAR (944) TO MINIMIZE WHITE RIBBON

BACKGROUND OF THE INVENTION

The present invention relates to an insulated gate field effect transistor (IGFET), particularly to an IGFET which has been subjected to a selective oxidation process with a silicon nitride ($Si_3N_4$) film used as a mask.

An IGFET which has been subjected to selective oxidation using a $Si_3N_4$ film as a mask suffers to a low extent from the parasitic channel effect, since the silicon dioxide ($SiO_2$) film on the areas other than the gate is sufficiently thick. Also, when the process is applied to an integrated circuit (IC), certain results are excellent, such as the integration density which can be much improved, and occurrences of a discontinuity in the wiring are reduced. However, the selective oxidation process simultaneously brings about the possibility of a dielectric breakdown of the insulated gate film at a low voltage, when the electric field between the substrate and the gate electrode is applied to the insulated gate film. Namely, such an IGFET has the problem that the breakdown voltage of the insulated gate film is lowered by the above-mentioned selective oxidation process.

FIGS. 1–4 show the formation of the field oxide film by the selective oxidation in a conventional IGFET production process, and the causes of the lowered breakdown voltage of the insulated gate film which are currently considered.

Figure 1:
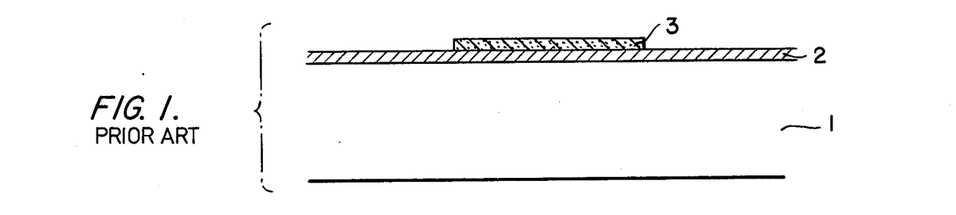
FIG. 1 is a cross-section of the oxidation resistant mask of the $Si_3N_4$ film formed on the single crystal silicon substrate on the $SiO_2$ film in the ordinary selective oxidation process.
Figure 2A:
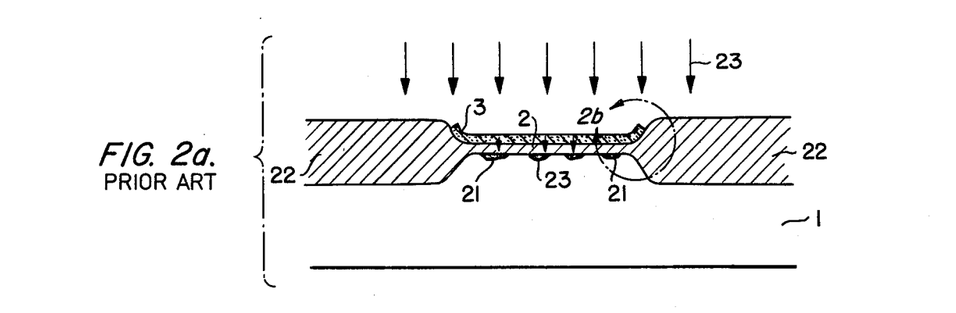
FIG. 2a is a cross-section of the substrate under the thermal oxidation using said $Si_3N_4$ film as the mask.

At first, as indicated in FIG. 1, the silicon dioxide film 2 is formed with a thickness of about 500 Å on the entire surface of the single crystal silicon substrate 1, and then the silicon nitride film 3 is selectively formed with a similar thickness on said $SiO_2$ film 2. Next, as indicated in FIG. 2a, the field oxide film 22 is caused to grow to a thickness of about 8000 Å on the single crystal silicon substrate 1, except at the gate portion, under a high temperature oxidizing atmosphere containing water vapor. However, in this selective oxidation process, the $H_2O$ in the water vapor and the $Si_3N_4$ in the film 3 react chemically as expressed by the reaction (1), producing $NH_3$.

$$Si_3N_4 + 6H_2O = 4NH_3 + 3SiO_2 \quad (1)$$

The ammonia ($NH_3$) easily passes through the $SiO_2$ film and therefore the $NH_3$ generated by the reaction (1) reaches the area under the $SiO_2$ film 2 of the gate portion and then reacts with the single crystal silicon substrate 1 in accordance with the reaction (2), producing $Si_3N_4$ at the regions 21, 23.

$$3Si + 4NH_3 = Si_3N_4 + 6H_2 \quad (2)$$

Figure 2B:
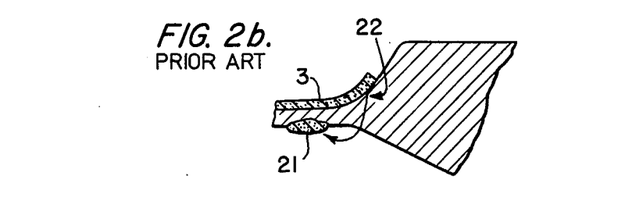
Figure 3:
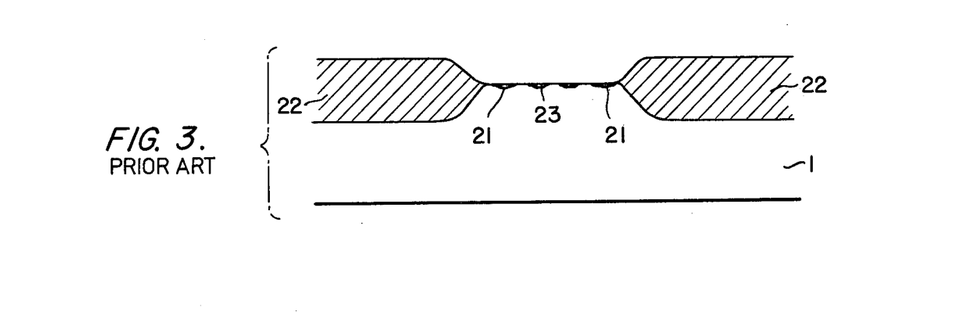
FIG. 3 is a cross section of the substrate wherein the $Si_3N_4$ film and $SiO_2$ film of the gate portion are removed after the ordinary selective oxidation process.

Among the regions of $Si_3N_4$ produced by the reaction (2), the region 21 at the boundary of the single crystal silicon substrate 1 under the end of the $Si_3N_4$ oxidation resistant mask 3 is called the "White Ribbon". FIG. 2b which shows an enlarged view of this part of FIG. 2a, where the $Si_3N_4$ region 21 is generated by the seepage of $H_2O$ from the end of the thick $SiO_2$ film. Detailed explanation is omitted here since by E. Kooi et al in the Journal of the Electro-Chemical Society, Vol. 123, at page 117 (1976). In addition, it is explained by Kowada et al in the Journal of Japanese Applied Physics, Vol. 17, No. 4, at page 737 (1978) that the breakdown voltage of the insulated gate film is lowered not only by the $Si_3N_4$ region 21 at the end of the gate region, but also by the $Si_3N_4$ regions which have a possibility of existing in the center region of the gate. The reason is considered to be that the $NH_3$ generated by the reaction between $H_2O$ and $Si_3N_4$, because of a crystal defect such as a pin-hole in the $Si_3N_4$ film 3, further reaches the Si substrate after passing through the lower $SiO_2$ film 2, producing the $Si_3N_4$ region 23. In addition, as indicated in FIG. 3, in the ordinary IGFET, the $Si_3N_4$ film 3 and the $SiO_2$ film 2 are removed after the selective oxidation, but the $Si_3N_4$ regions 21, 23 that formed during the selective oxidation still remain. This is mainly because the $Si_3N_4$ regions 21, 23 may not exist as simply films, but they may be combined in a complicated manner with the impurity particles contained in the area near the surface of the single crystal silicon substrate 1, which may act as nuclei. Namely, since the insulated gate film is formed while these nitrides remain, a homogeneous film thickness cannot be obtained and as a result the breakdown voltage is lowered. In the case of an ordinary IGFET, the $SiO_2$ to be provided between the gate electrode and the silicon base plate must be formed as thin as possible in order to provide a large electrostatic capacitance to the gate. However, when the $SiO_2$ film becomes too thin, the breakdown voltage is drastically lowered. Such lowering of the breakdown voltage is a major barrier for improving the characteristics of the IGFET.

A method involving the lowering of the reaction temperature at the time of the selective oxidation is proposed by B. W. Ormont et al in the Summary of Papers of the Electro-Chemical Society Spring Meeting (Boston), Abstract No. 89, at page 231 (1979), as the means for avoiding such lowering of the breakdown voltage in the insulated gate film due to the selective oxidation.

However, methods involving the lowering of the reaction temperature are inadequate for the actual process because an oxidation time of about 5 hours is usually required for obtaining a field oxide film of about 8000 Å at a temperature of 1100° C., and about 13 to 14 hours are required at a temperature of 950° C. Moreover, B. W. Ormont et al also propose a method of using a thick $Si_3N_4$ film as the oxidation resistant mask. However, it is undesirable to make the $Si_3N_4$ film thick enough for preventing lowering of the breakdown voltage, because the stress applied on the base plate at the time of the selective oxidation increases.

Therefore, a method is needed for preventing the lowering of the breakdown voltage of the gate insulating film of an IGFET even when the selective oxidation is performed using a $Si_3N_4$ film as a mask.

SUMMARY OF THE INVENTION

It is an object of the present invention to provide an IGFET which does not cause lowering of the breakdown voltage of the gate insulating film, even when the selective oxidation is carried out using the $Si_3N_4$ film as the mask.

It is another object of the present invention to provide an IGFET which is excellent in its breakdown voltage even when the gate insulating film is made very thin and the electrostatic capacitance of the gate portion is made very large.

It is a further object of the present invention to provide an IGFET which is excellent in its breakdown voltage and in other characteristics such as low threshold voltage, high mutual conductance, etc.

It is still a further object of the present invention to provide an IGFET which substantially eliminates the cause of lowered breakdown voltage of the gate insulating film, and which does not require increasing the production steps and the production time.

The IGFET of the present invention uses a single crystal silicon substrate, in which the orientation of the surface is deviated by an angle in the range from 22° to 34° from the {100} crystallographic surface toward the {111} surface. In the case of the present invention, the gate insulating film is formed on such a surface, the gate electrode is then formed on the gate insulating film as in the case of the ordinary IGFET, and the electric field is then applied between this gate electrode and said single crystal silicon substrate across the gate insulating film. Moreover, the present invention provides, as in the case of the ordinary IGFET, an $SiO_2$ film formed on and embedded in the single crystal silicon substrate, with a thickness that is greater than the gate insulating film obtained by selectively oxidizing the substrate using the $Si_3N_4$ film as the mask.

More desirably, further improved characteristics can be obtained by forming an epitaxial layer on the single crystal base plate to serve as the above-mentioned substrate. As the surface of the base plate on which the aforementioned epitaxial layer is grown, the crystallographic surface (311) is particularly excellent among the surfaces of the single crystal silicon base plate within the range of orientation in the present invention, and an adequate thickness of the epitaxial layer is 3 microns or more.

The objects of the present invention are attained by the IGFET of the present invention as explained in detail below.

In order to attain such objects, attention is first focused on the surface orientation of the silicon base plate on which the IGFET is formed.

The crystallographic surface orientation is determined by sets of three integers which are known as Miller indices, which are defined in the basic technical references. Miller indices within parentheses indicate a certain specific surface within a crystal, while Miller indices within the curly brackets indicate a group of surfaces which are crystallographically equal, and Miller indices within square brackets indicate specific directions within a crystal.

Usually, the silicon wafer used for an IGFET has a surface which is essentially the crystallographic surface {100}. This is mainly because such a condition is required by the number of charges ($N_{FB}$) induced mainly at the boundary of the single crystal silicon base plate and the gate insulating film, and by the mobility ($\mu_s$) of the carriers in regard to the operation of the IGFET at the area near the surface of the base plate. Namely, $N_{FB}$ has a minimum value at the surface {100} while $\mu_s$ has a maximum value. Therefore, an IGFET having low threshold voltage and high mutual conductance can be produced.

However, an IGFET with the surface (100) has the lowest breakdown voltage of the gate insulating film, as compared with those wherein another crystallographic surface is selected for executing the selective oxidation using the $Si_3N_4$ film as a mask. Moreover, according to the experimental results of the inventors of the present invention, when the ordinary selective oxidation process is carried out under a temperature of 1100° C., the IGFET formed on a substrate having a surface (100) as the major plane surface generates a so-called "short breakdown", wherein the gate insulating film breaks down resulting in a perfectly conductive condition for a relatively low voltage applied to the gate electrode. On the other hand, the IGFET formed on the (111) surface generates the so-called "self-heal breakdown", wherein the gate insulating film becomes conductive one time but is immediately cured, even when a voltage which is higher by about 10 times than the voltage which causes the "short breakdown" above is applied.

The mechanism resulting in the low breakdown voltage is already explained above. Explained next is the probable reason of the low breakdown voltage depending on the crystallographic surface.

Generally, a crystallographic surface is not atomically flat but is considered to consist of structural steps. Since the surface {111} of the single crystal silicon is considered as the flatter surface with fewer steps, the step density is considered to increase as the single crystal silicon surface is deviated toward the surface (100) from the surface (111). Since a thermodynamical kink which exists even in the thermally balanced condition is generated mainly in these steps, the kink density increases as in the case of said step density when the single crystal silicon surface is deviated toward the surface (100) from the surface (111). Particularly, since the kink location is the area where particles are absorbed most easily, the largest number of impurity particles are estimated to be absorbed on the surface (100). As explained above, the low breakdown voltage after selective oxidation is considered to result from nitride generated at the boundary of the silicon base plate due to the reaction between the selective oxidation mask consisting of $Si_3N_4$ and $N_2O$, as is proved by a variety of experimental results. Since the reaction of producing said nitride proceeds with the impurity particles contained in the area near the single crystal silicon base plate surface acting as nuclei, the amount of nitride generated at the boundary of the single crystal silicon base plate, which ultimately determines the breakdown voltage, depends on the number of impurity particles being absorbed onto said single crystal silicon base plate surface. Namely, when the crystallographic surface {111} is used as the single crystal silicon base plate surface, the step density at the base plate surface in the atomic range is minimized, the kink density at the surface is also minimized, and the amount of impurity particles absorbed onto the surface is also minimized. These values are considered to increase as the surface is inclined toward the {100} crystallographic surface. Moreover, since the chemical reaction indicated by the reaction (2) proceeds depending upon the amount of impurity particles absorbed onto the single crystal silicon base plate surface, the least amount of $Si_3N_4$ is formed at the boundary when the crystallographic surface {111} is used as the single crystal silicon base plate surface, and such amount increases as the substrate surface is deviated gradually toward the crystallographic surface {100}.

From the above explanation, when the selective oxidation is carried out using the $Si_3N_4$ film as the mask, the IGFET has the optimum breakdown voltage characteristic when the crystallographic surface {111} is selected as the single crystal silicon base plate surface, and such breakdown voltage is lowered as said surface is deviated toward the surface {100}.

However, an IGFET which is excellent only in the breakdown voltage of the gate insulating film cannot be said to be a device having sufficiently optimal overall characteristics. If an IGFET cannot satisfy other factors, such as sufficiently small $N_{FB}$ and sufficiently large $\mu_s$, (for which the single crystal silicon base plate having the crystallographic surface (100) is mainly used), such an IGFET cannot be said to have excellent overall characteristics. Our experiments for surveying the values of $N_{FB}$, $\mu_s$ and the breakdown voltage of the gate insulating film, after the selective oxidation process, was made using an $Si_3N_4$ film as the mask by forming IGFET's on various silicon substrates having surfaces deviated from the (100) surface toward the (111) surface. These experiments have proved that the factors specifying the characteristics of respective devices do not change linearly with the deviated angles. Simultaneously, it is also proved that the respective dependencies, on the inclination angle of the base plate, of the characteristics $N_{FB}$, $\mu_s$ and the breakdown voltage of the gate insulating film, show different characteristics. With the present invention, an IGFET having excellent overall characteristics and having satisfactory values of $N_{FB}$, $\mu_s$ and breakdown voltage within a specific range of deviation angle can be obtained.

Firstly, in regard to the breakdown voltage of the gate insulating film, a sufficient value is obtained by inclining the surface by 22° or more toward the surface (111) from the surface (100), with reference to the IGFET using the single crystal silicon base plate and formed by the ordinary process which is usually utilized when the crystallographic surface (100) is used as the major plane surface.

Secondly, satisfactory values for the functional characteristics can be obtained with $N_{FB}$ having a value less than approximately $10^{11}/cm^2$, and it has also been shown that such value can be assured when the crystallographic surface is deviated up to 34° from the surface (100) toward the surface (111).

Thirdly, no significant variation of $\mu_s$ is found in the range of the deviation angle of 0° to 45° from the (100) surface toward the (111) surface.

On the basis of the above explanation, the present invention offers an IGFET using the single crystal silicon base plate having the surface inclined only by an angle within the range specified by these factors, namely by an angle in the range from 22° to 34° toward the crystallographic surface {111} from the {100} crystallographic surface. Consequently, the IGFET offered thereby has excellent overall characteristics and particularly assures a high breakdown voltage of the gate insulating film even after the selective oxidation using the $Si_3N_4$ film as the mask.

As explained above, in the present invention, attention is focused at first on the crystallographic surface orientation of the single crystal silicon base plate in view of improving the breakdown voltage of the gate insulating film, which is a main object of the present invention. Then the inventors of the present invention noted the impurity particles contained in the silicon semiconductor substrate forming an IGFET, particularly those existing in the area near the substrate surface. As explained previously, a nitride produced during the selective oxidation using the $Si_3N_4$ film as a mask is the major cause of lowering the breakdown voltage of the gate insulating film, and the impurity particles adhering to the area near the surface of the single crystal silicon base plate promote the chemical reaction producing the nitride. As mentioned, the crystallographic surface orientation of the base plate has been determined depending on the amount of impurity particles absorbed onto the crystallographic surface inclined at a certain angle in order to reduce the amount of impurity particles existing at the area near the base plate surface. However, in practice, only a very small amount of impurity particles is absorbed onto the crystallographic surface {111} as compared with other surfaces, but this amount is not exactly zero. Therefore, the breakdown voltage of the gate insulating film can be more improved by reducing the amount of impurity particles contained in the silicon base plate itself without relation to the crystallographic surface orientation.

Currently, an ordinary IGFET is formed on the single crystal silicon base plate in the bulk condition. However, it is generally known that the single crystal silicon layer obtained by epitaxial growth contains smaller amounts of impurity particles as compared with the single crystal silicon in the bulk condition. In addition, the epitaxial growth occurs along the same crystal axis as the single crystal silicon base plate. For example, on the base plate having the crystallographic surface (100) surface, the epitaxial layer is formed with the surface (100).

Therefore, a lesser amount of impurity particles is absorbed by deviating the surface toward the surface (111) by a certain angle from the surface (100) of the single crystal silicon substrate, and the same is also true of the epitaxial layer formed on such a substrate. Moreover, the expitaxial layer contains a lesser amount of impurity particles as compared with the substrate in the bulk condition, and thereby a single crystal silicon substrate allowing absorption of even a smaller amount of impurity particles can be obtained.

In the case of the present invention, as explained previously, the surface of the single crystal silicon substrate is deviated within the range from 22° to 34° toward the surface (111) from the surface (100), and the epitaxial layer is additionally formed on such a substrate, thereby further improving the breakdown voltage of the gate insulating film.

It is also known that growth of an epitaxial layer which is particularly excellent in the lattice arrangement, in which the crystal axes match with those of the substrate, is distinct at the crystallographic surface having a surface orientation indicated by Miller indices with integer values. The above-mentioned range includes the crystallographic surface {311} wherein the surface is deviated by about 25.2° toward the surface {111} from the surface {100}. This is a preferable surface for the present invention.

When forming an IGFET on the epitaxial layer, the thickness of the epitaxial layer must be considered. In the ordinary IGFET, only the area near the substrate surface is related to the operation of the device. In addition, in the case of the present invention, a particular thickness is not required since the epitaxial layer is formed in order to improve the breakdown voltage of the gate insulating film after the selective oxidation, that is, to reduce the amount of the impurity particles adhered to the substrate surface. However, the crystallization is not so good and is unstable at the boundary of the single crystal substrate and the epitaxial layer. For this reason, it is desirable for the formation of the IGFET on a stable epitaxial layer that the epitaxial layer have a thickness of at least 3 microns.

BRIEF DESCRIPTION OF THE DRAWINGS

FIG. 2b is a cross-section wherein nitride is formed at the boundary of the silicon substrate and the $SiO_2$ film, at the end of the mask of FIG. 2a.

FIGS. 5-8 show respectively the processes wherein the oxidation resistant $Si_3N_4$ film mask is formed on the $SiO_2$ film, and then selective oxidation is performed so that a thick $SiO_2$ film is formed. FIGS. 9-11 show steps for completing the device.

DETAILED DESCRIPTION OF THE PREFERRED EMBODIMENTS

Figure 4:
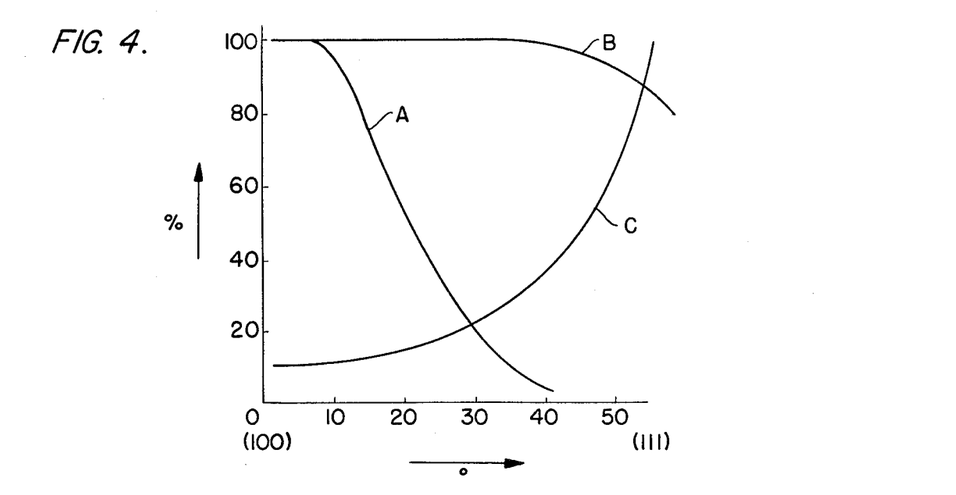
FIG. 4 shows various results of tests of an IGFET using single crystal silicon substrates having different crystallographic surface orientations. The curve A is the breakdown voltage of the gate insulating film, curve B is the mobility $\mu_s$ at the area near the substrate surface and curve C is the number of charges $N_{FB}$ induced at the boundary of the substrate and the gate insulating film.

An IGFET of the present invention will be described by referring to FIG. 4. In FIG. 4, the curve A is the result of a breakdown voltage test of the gate insulating film. Both n and p conductivity type substrates were used as the single crystal silicon substrate, and the selective oxidation was carried out using the $Si_3N_4$ film as the mask before formation of the gate insulating film. In the selective oxidation, a field oxide film with thickness of about 7800 Å was formed at a temperature of about 1100° C. as in the ordinary oxidation process. Here, the thickness of the $SiO_2$ film formed on the entire part of the surface of the silicon substrate, before the selective oxidation process was about 500 Å, and the thickness of the $Si_3N_4$ film was about 500 Å. After the selective oxidation process, the $Si_3N_4$ film and the $SiO_2$ film formed on the gate portion were removed from the substrate surface and then a $SiO_2$ film was newly formed with thickness of about 1000 Å as the gate insulating film.

For the breakdown voltage test, an electrical field up to $5 \times 10^6$ V/cm is applied, which causes total breakdown and a fully conductive condition to the gate insulating film on the substrate having the crystallographic surface (100). The vertical axis of FIG. 4 shows the percentage of all samples of the same kind that were subjected to the test. The horizontal axis indicates the deviation angle in degrees of the crystallographic surface toward the surface (111) from the surface (100).

For the zero inclination case, the breakdown voltage failure rate of the gate insulating film is a maximum and all samples suffered breakdown. On the other hand, the failure rate is a mininum for the crystallographic surface (111) inclined by about 54.7° from the surface (100), and none of the samples suffered breakdown. No difference in the breakdown voltage depending on the conductivity type of the substrate could be found. The dependence on inclination angle of the crystallographic surface of the breakdown voltage failure rate is gradually improved within the range of inclination angle from 10° to 40°.

Undesirable lowering of the breakdown voltage of the gate insulating film may be generally defined to be prevented by accepting a breakdown voltage failure rate of 50% or less with the electrical field as high as $5 \times 10^6$ V/cm, which causes a failure rate of 100% for the crystallographic surface (100) with ordinary IGFET. From FIG. 4, the breakdown voltage failure rate of 50% is obtained at the point where the crystallographic suface is deviated by 22° toward the surface (111) from the surface (100). Concerning this point, a gate insulating film consisting of $SiO_2$ in the thickness of about 1000 Å suffers few breakdowns for application of a gate voltage of about 30 V or less, and an IGFET which is excellent in the breakdown voltage characteristic can be obtained.

The curve C in FIG. 4 indicates the dependence on the crystallographic surface orientation of the number of charges $N_{FB}$ induced at the boundary of the single crystal silicon substrate and the $SiO_2$ film used as the gate insulating film. This is the result of a test using the $SiO_2$ film formed by the same process as that for said breakdown voltage test as the gate insulating film. Here, the vertical axis indicates the $N_{FB}$ for the different crystallographic surfaces, wherein the value for the surface (111) is taken as 100%. The values of $N_{FB}$ increase when the angle of the crystallographic surface orientation is deviated by 20° or more from the surface (100). The $N_{FB}$ value determines the boundary level, and is the factor for determining many functional characteristics such as threshold voltage, mutual conductance, etc. The $N_{FB}$ value becomes $10^{11}/cm^2$ or more when the surface is deviated by 34° or more toward the surface (111) from the surface (100), and for larger values an element that is superior in the functional characteristics cannot be obtained.

The curve B in FIG. 4 indicates a dependence on the crystallographic surface orientation of the mobility $\mu_s$ of the carrier in the area related to the operation of the IGFET, near the silicon substrate surface. The vertical axis indicates the values for the respective crystallographic surfaces in units of percentage wherein the value at the crystallographic surface (100) is taken to be 100%. The mobility $\mu_s$ changes little until the inclination angle of the crystallographic surface reaches about 45°.

From the curves A to C in FIG. 4, namely from the respective requirements of breakdown voltage of the gate insulating film, mobility $\mu_s$ and the number of charges $N_{FB}$ at the boundary, the present invention proposes that the surface of the single crystal silicon substrate used for an IGFET be deviated within the range from 22° to 34° toward the crystallographic surface {111} from the surface {100}.

Moreover, it is desirable in the present invention to provide an epitaxial layer on the single crystal silicon substrate. In regard to the factors such as $N_{FB}$ and $\mu_s$ which specify the functional characteristics of an IGFET as indicated in FIG. 4, a distinctive change cannot be found even when the epitaxial growth is performed. However, the breakdown voltage failure rate of the gate insulating film is very much improved as a whole by providing the epitaxial layer. Therefore, in order to further improve the breakdown voltage characteristic of an IGFET, an epitaxial layer is grown on a single crystal silicon substrate a crystallographic surface deviated by 22° to 34° toward the crystallographic surface {111} from the surface {100}. Moreover, an epitaxial layer having good crystallization can be obtained by using a substrate wherein the crystallographic surface within said range, particularly the surface {311}, is used as the major plane surface of the substrate for the epitaxial layer. In addition, an adequate thickness of the epitaxial layer is 3 microns or more for the above-mentioned reason, and a thicker epitaxial layer obtained by epitaxial growth will not provide any particular improvement in the element characteristics and only requires a longer time to be formed.

Figure 5:
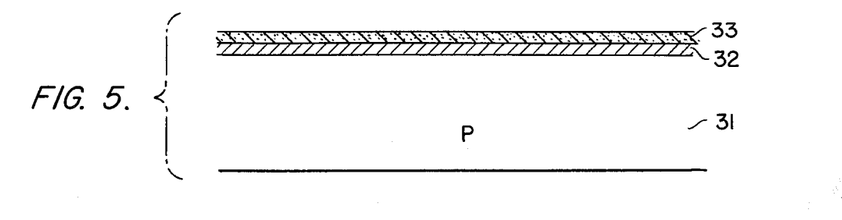
FIGS. 5-11 are cross-sections of the substrate while forming an IGFET using the single crystal silicon substrate of the present invention. Particularly.

The preferred IGFET forming process of the present invention will be explained below by referring to the drawings. FIGS. 5-11 respectively show the formation of an IGFET using the substrate wherein the surface is deviated as in the present invention. FIG. 5 shows the profile wherein the $SiO_2$ film 32 and $Si_3N_4$ film 33 are respectively formed on the single crystal silicon substrate.

Firstly, a single crystal silicon substrate 31 having p-type conductivity, a specific resistance of about 10 ohms, and a thickness of about 600 microns wherein the crystallographic suface is deviated by 25° toward the surface {111} from the surface {100}, is selected. Thereafter, the surface of the single crystal silicon substrate 31 is totally oxidized under ambient oxygen containing HCl at about 5%. After the oxidation process for about 30 min., an $SiO_2$ film 32 of about 500 Å is obtained. Then, a $Si_3N_4$ film 33 is formed on the $SiO_2$ film by a known CVD chemical vapor deposition (CVD) method. The growth of $Si_3N_4$ is carried out at a temperature of about 800° C. under an ambient atmosphere of $SiH_4:NH_3 = 1:50$ as a typical epitaxial growth condition, and thereby a thickness of about 500 Å can be obtained.

Figure 6:
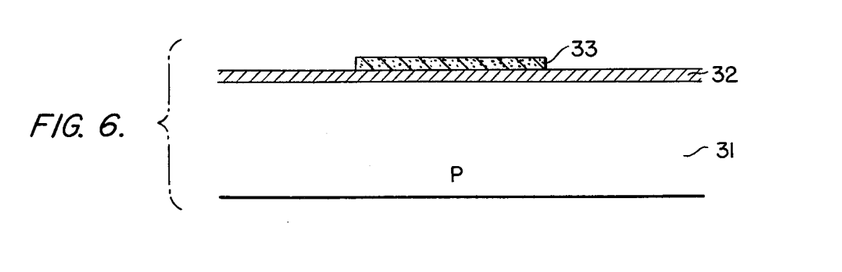

FIG. 6 shows the profile wherein the $Si_3N_4$ film 33 remains over the $SiO_2$ film 32 on the IGFET forming area. As the first step, the resist is coated on the entire part of the major plane surface of the single crystal silicon substrate 31 and the IGFET forming region is developed by patterning. Next, the $Si_3N_4$ film 33 is left only on the IGFET forming area and is removed in the other area by means of a conventional plasma etching method. As in the case of ordinary IGFETs, boron ions in an amount of about $3.5 \times 10^{13}/cm^2$ are injected with an energy of about 40 KeV into the surface of the substrate using the remaining $Si_3N_4$ film 33 as a mask in order to form the channel cut region.

Figure 7:
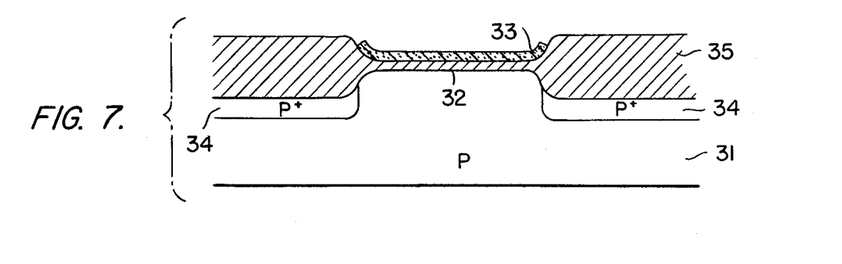

FIG. 7 shows the profile wherein a thick $SiO_2$ film 35 is formed by thermal oxidation using the $Si_3N_4$ film 33 as a mask. Since the $Si_3N_4$ film shows an excellent oxidation resistant characteristic, it is used as the oxidation mask for the ordinary selective oxidation process. This $Si_3N_4$ film has the problem mentioned previously, but its use as an oxidation mask is inevitable since an alternative has not yet been obtained.

Typically, on the region from where the $Si_3N_4$ film has been removed, an $SiO_2$ film 35 of about 7800 Å thickness is formed by thermal oxidation for about 4 hours at a temperature of about 1100° C. under a wet oxygen ($O_2$) ambient atmosphere (containing water vapor). Simultaneously, the boron ions previously injected become active due to the annealing of the process, thus forming the p+ region 34 which will becomes the channel cut region.

Figure 8:
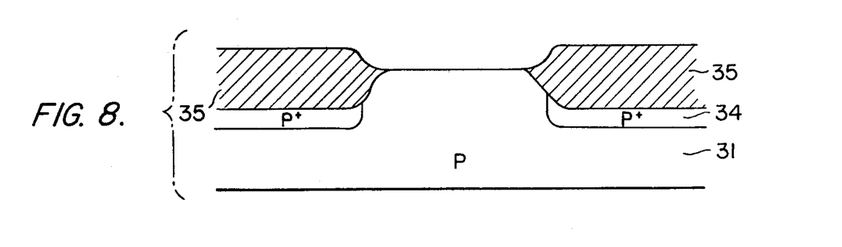

FIG. 8 shows the profile wherein the thin $SiO_2$ film 32 is removed from the IGFET forming region. At first, the $SiO_2$ being formed on the area near the surface of said $Si_3N_4$ film 33 is entirely removed using the buffer-HF as the etching solution. Next, the $Si_3N_4$ film 33 is removed from the surface of the substrate using hot-$H_3PO_4$ as the etching solution. Moreover, a comparatively thin $SiO_2$ film 32 on the IGFET forming region is removed using again the buffer-HF. Here, in an ordinary single crystal silicon substrate wherein the crystallographic surface (100) is selected, a nitride newly produced by the selective oxidation process still remains even after the etching in the IGFET forming region, but in the case of using the substrate of the present invention wherein the surface is selected to be the crystallographic surface deviated by 25° toward the surface {111} from the surface {100}, the nitride compound is not substantially formed at the boundary of the single crystal silicon substrate, and does not remain as indicated in FIG. 8 after removal of the $SiO_2$ film.

Figure 9:
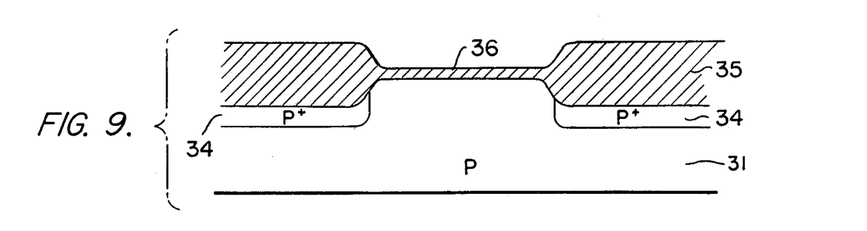

FIG. 9 shows a profile wherein the gate insulating film is formed on the single crystal silicon substrate 31. The gate $SiO_2$ film 36 is formed with a thickness of about 500 Å on the IGFET forming region under an oxygen ambient atmosphere of about 1100° C. containing HCl in about 5%. Here, since the boundary of the single crystal silicon substrate and the $SiO_2$ film 36 is very stable as indicated in FIG. 8, a good $SiO_2$ film 36 having homogeneous thickness can be formed.

Figure 10:
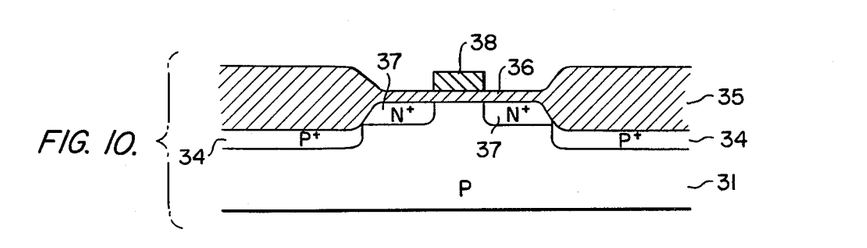

FIG. 10 shows a profile wherein the n+ source and drain regions 37 are provided separately within said single crystal substrate 31 and the gate electrode 38 consisting of polycrystalline silicon is formed on said gate $SiO_2$ film 36.

At first, the polycrystalline silicon is formed by the CVD method on the entire surface of the substrate, then a resist film is coated on the surface of the polycrystalline silicon film, patterning is performed in the gate electrode forming region, and the gate electrode 38 is formed by etching only the polycrystalline silicon film with nitric or fluoric acid. On the other hand, the ion implantation is carried out only in the area where a thin $SiO_2$ film 36 is formed on the single crystal silicon substrate using the gate electrode 38 as the mask. Here, As ions in amount of $4 \times 10^{15}/cm^2$ may be implanted with an energy of about 120 KeV. Thereafter, the As implanted ions are activated, thereby forming the source/drain region 37 having n-type conductivity.

Figure 11:
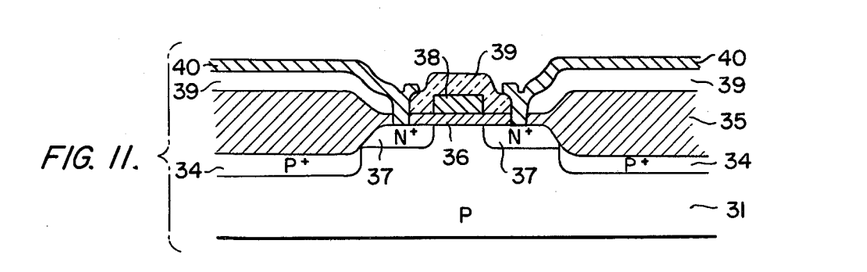

FIG. 11 shows a profile wherein an IGFET is completed with disposition of the electrodes connecting to said source/drain regions 37.

First, the PSG film 39 is formed on the entire surface of the substrate by the CVD method using $SiH_4$, $PH_4$ and $O_2$ gases. Next, a boring is performed by an etching method through the PSG film 39 and thin $SiO_2$ film 36 for the contact with the source/drain regions 37. Moreover, an aluminum electrode 40 is formed by evaporation, thus completing the IGFET.

Figure 12:
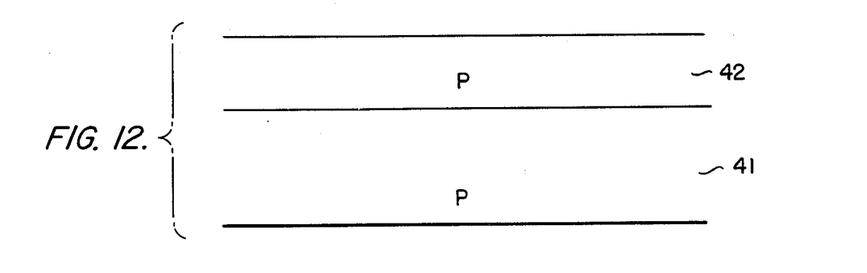
FIG. 12 is a cross-section of the base plate wherein the epitaxial layer is formed on the major plane surface of the single crystal silicon substrate of the present invention.
Figure 13:
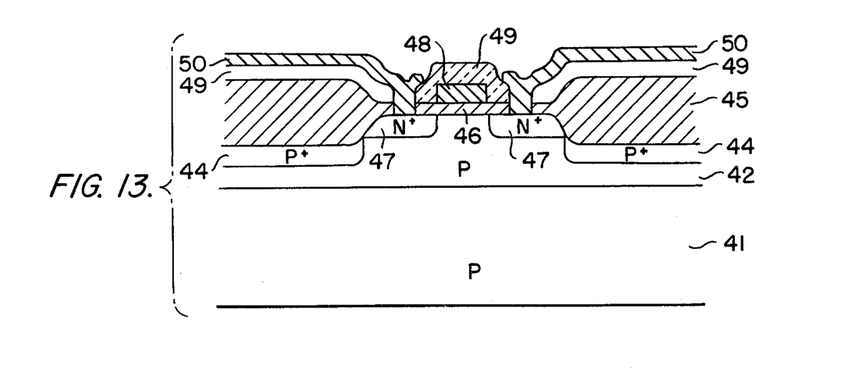
FIG. 13 is a cross-section of an IGFET formed in the same processes as indicated in FIGS. 5-11 using the base plate indicated in FIG. 12.

As described above, FIGS. 5-11 show the process of forming an IGFET using the single crystal silicon substrate of the present invention. FIGS. 12, 13 as described below show the process of forming an IGFET using the epitaxial layer of the present invention.

FIG. 12 shows the silicon substrate of the present invention. The p-type epitaxial layer 42, which has the same conductivity type as the substrate and has a specific resistance of 10 ohms, is formed with a thickness of about 3 microns on the single crystal silicon substrate having the surface (311). as the surface. Here, the crystallographic surface orientation of the epitaxial layer is also (311) as in the case of the substrate 41.

FIG. 13 shows the profile wherein an IGFET is completed in said substrate layer. With the same process explained in regard to said FIGS. 5-11, an IGFET is formed in the epitaxial layer 42. Here, 44 is the p+ type channel cut region, 45 is the thick $SiO_2$ film, 46 is the thin $SiO_2$ film of the gate portion, 47 is the n+ type source/drain region, 48 is the gate electrode of polycrystalline silicon, 49 is the PSG film, and 50 is the aluminum electrode.

What is claimed is:

1. An insulated gate field effect transistor comprising:
    a single crystal silicon substrate having a surface deviated by an angle within a range of 31° to 34° from the {100} crystallographic surface toward the {111} crystallographic surface,
    a gate insulating film less than 1000 Å in thickness on said surface of said substrate,
    a gate electrode on said gate insulating film for providing an electric field to said substrate across said gate insulating film, and
    a thermally oxidized film selectively formed on and embedded in said substrate, said thermally oxidized film having a greater thickness than said gate insulating film.

2. The transistor of claim 1, wherein said substrate comprises a single crystal silicon base plate and a silicon epitaxial layer formed thereon.

3. The transistor of claim 2, wherein said silicon epitaxial layer has a thickness of not less then 3 microns.

4. An insulated gate field effect transistor comprising;
    a single crystal silicon substrate having a crystallographic orientation deviating in the range from 31° to 34° from the [100] axis toward an axis, in the (100) plane, that is approximately 45° off one of the axes [010], [001], [0$\bar{1}$0] and [00$\bar{1}$],
    a gate insulating film less than 1000 Å thick on said surface of said substrate;
    a gate electrode on said gate insulating film for providing an electric field to said substrate across said gate insulating film, and
    a thermally oxidized film selectively formed on and embedded in said substrate, said thermally oxidized film having a greater thickness than said gate insulating film.

5. The transistor of claim 4, wherein said substrate comprises a single crystal silicon base plate and a silicon epitaxial layer formed thereon.

6. The transistor of claim 5, wherein said silicon epitaxial layer has a thickness of not less than 3 microns.

7. The transistor of claim 1, 2, 3, 4 or 5, wherein said gate insulating layer is a thermally oxidized layer, and the boundary between said gate insulating layer and said substrate is effectively free from nitride spots.

8. A plurality of the transistors of claim 1, 2, 3, 4, or 5, wherein the gate insulating films have a failure rate of no more than 50% for a maximum value of said field across each of said gate insulating films of $5 \times 10^6$ V/cm, and the number of charges $N_{FB}$ at the boundary of each said gate insulating film and the respective substrate is no more than $10^{11}/cm^2$.

* * * * *

UNITED STATES PATENT AND TRADEMARK OFFICE
CERTIFICATE OF CORRECTION

PATENT NO. : 4,454,525

DATED : June 12, 1984

INVENTOR(S) : Wada et al

It is certified that error appears in the above-identified patent and that said Letters Patent is hereby corrected as shown below:

Front page, [57] ABSTRACT,
   line 2, "where" should be --a--;
   line 3, delete "degree" (first occurrence);
   line 3, "degree" both occurrences should read --degrees--;
   line 5, "the" should be --a--;
   line 6, "Here, generation" should be --The method can suppress the accumulation--; delete "is sup-";
   line 7, delete "pressed"; delete "is newly"; "formed" should be --forms--; "the" (both occurrences) should be --a--;
   line 8, "the" should be --a--.
   line 9, "the" (first occurrence) should be --a--; "and also is" should be --, which--.
   line 11, after "tion," insert --there is no interference with--;
   line 12, delete "are not";
   line 13, delete "interfered at all";
   line 13, delete "Thereby, the present inven";
   line 13, delete "tion can";
   line 14, "offer an IGFET which" should be --The IGFET can be--; after "improved" insert --in--.
   line 16, after "keeping" insert --optimum--; Change "at the best" to --.--; line 17, delete "condition".

Column 2, line 14, "simply" should be --simple--.

Column 5, line 4, delete ",".

Column 8, line 4, "mininum" should be --minimum--.

UNITED STATES PATENT AND TRADEMARK OFFICE
CERTIFICATE OF CORRECTION

PATENT NO. : 4,454,525
DATED : June 12, 1984
INVENTOR(S) : Wada et al

It is certified that error appears in the above-identified patent and that said Letters Patent is hereby corrected as shown below:

Column 9, line 33, "suface" should be --surface--.

Column 10, line 5, "becomes" should be --become--.

Column 11, line 8, "(311)." should be --(311)--.

Signed and Sealed this

Nineteenth Day of March 1985

[SEAL]

Attest:

DONALD J. QUIGG

Attesting Officer  Acting Commissioner of Patents and Trademarks